United States Patent
Lee

(10) Patent No.: US 7,250,361 B2
(45) Date of Patent: Jul. 31, 2007

(54) METHOD FOR FORMING A BONDING PAD OF A SEMICONDUCTOR DEVICE INCLUDING A PLASMA TREATMENT

(75) Inventor: Kae-Hoon Lee, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 274 days.

(21) Appl. No.: 10/889,398

(22) Filed: Jul. 12, 2004

(65) Prior Publication Data
US 2005/0009314 A1    Jan. 13, 2005

(30) Foreign Application Priority Data
Jul. 11, 2003   (KR) ............... 10-2003-0047268

(51) Int. Cl.
*H01L 21/44* (2006.01)
*H01L 21/302* (2006.01)
(52) U.S. Cl. ............. 438/612; 438/617; 438/710; 257/E23.02
(58) Field of Classification Search ......... 438/612, 438/617, 710; 257/E23.02
See application file for complete search history.

(56) References Cited

U.S. PATENT DOCUMENTS

| | | | |
|---|---|---|---|
| 5,700,740 A * | 12/1997 | Chen et al. ............ | 438/710 |
| 5,925,212 A * | 7/1999 | Rice et al. ............ | 156/345.27 |
| 6,006,764 A | 12/1999 | Chu et al. | |
| 6,355,576 B1 | 3/2002 | Haley et al. | |
| 6,638,855 B1 * | 10/2003 | Chang et al. ............ | 438/637 |
| 2001/0019180 A1 * | 9/2001 | Aoyagi et al. ............ | 257/784 |
| 2001/0019894 A1 * | 9/2001 | Peng et al. ............ | 438/689 |
| 2001/0055848 A1 * | 12/2001 | Minn et al. ............ | 438/281 |
| 2003/0168086 A1 * | 9/2003 | Yamaguchi et al. ....... | 134/30 |
| 2004/0115934 A1 * | 6/2004 | Broz et al. ............ | 438/689 |

OTHER PUBLICATIONS

Chang Won Jung; Method for Forming Multi-Metal Layer of Semiconductor Device; Korean Patent Abstracts; Date of Filing: Apr. 18, 1996; 6 Pages; Application No. 1019960011721; Korean Intellectual Property Office; Date of Publication: Apr. 15, 1999.

Jae Koo Kang; Plasma Process Device; Korean Patent Abstracts; Date of Filing: May 30, 2000; 6 Pages; Application No. 1020000029414; Korean Intellectual Property Office; Date of Publication: Aug. 5, 2000.

* cited by examiner

*Primary Examiner*—William M. Brewster
(74) *Attorney, Agent, or Firm*—Andrew D. Fortney

(57) ABSTRACT

Disclosed is a method for forming a bonding pad of a semiconductor device. The present invention provides a method for forming a bonding pad of a semiconductor device comprising the steps of: (a) forming a top metal line having a predetermined width on a structure of a semiconductor substrate; (b) forming an insulating layer on the top metal line and the structure of the semiconductor substrate; (c) selectively etching the insulating layer to form a bonding pad which exposes portions of the top metal line; (d) performing a plasma treatment over the semiconductor substrate by using $CF_4$, Ar, and $O_2$ gas.

19 Claims, 2 Drawing Sheets

METHOD FOR FORMING A BONDING PAD OF A SEMICONDUCTOR DEVICE INCLUDING A PLASMA TREATMENT

CLAIM OF PRIORITY

This application makes reference to, incorporates the same herein, and claims all benefits accruing under 35 U.S.C. §119 from an application for SEMICONDUCTOR DEVICE AND FORMATION METHOD OF BONDING PAD IN THE SEMICONDUCTOR DEVICE earlier filed in the Korean Industrial Property Office on 11 Jul. 2003 and there duly assigned Serial No. 2003-47268.

BACKGROUND OF THE INVENTION (a) Field of the Invention

The present invention relates to a method for manufacturing a semiconductor device, and more particularly, to a method for forming a bonding pad of a semiconductor device.

(b) Description of the Related Art

Generally, a bonding pad functions as a terminal which connects a semiconductor device with its package. After packaging the semiconductor device including the bonding pad exposing some portions of a top metal line of the device, portions being used as a pin are mutually connected through the bonding works. These bonding works realize the connection of the metal line in the device with the outer power supply.

For good result of the bonding works, it is required that there is no impurities or oxide layer on the surface of the bonding pad.

U.S. Pat. Nos. 6,006,764 and 6,355,576 disclose a conventional bonding pad structure for superior adhesion.

FIG. 1 is a cross-sectional view of a conventional bonding pad of a semiconductor device. With reference to FIG. 1, a lower insulating layer 2 such as oxide layer is formed on a structure 1 of a semiconductor substrate, which includes individual devices over a semiconductor substrate or a lower metal line over a semiconductor substrate.

A top metal line 3 which is formed of Al or Cu is formed on the lower insulating layer 2.

An upper insulating layer 4 is formed on the top metal line 3 and the lower insulating layer 2. Portions of the upper insulating layer 4 are etched to form a bonding pad 100 which exposes portions of the top metal line 3.

After forming the bonding pad 100 as described above, $O_2$ treatment to remove impurities from the exposed surface of the top metal line 3 is performed, and then wire bonding process is performed.

In wire bonding process, pre-cleaning process is usually performed before the bonding work.

Even though the $O_2$ treatment and the pre-cleaning process is performed, the exposed surface of the top metal line 3 reacts with oxygen in atmosphere to form oxide layer 5 of $Al_2O_3$.

Due to the $Al_2O_3$, adhesion strength of the solder in wire bonding becomes weak and the bonding is poor. In order to restore the bonding, re-working of the bonding pad is required, and therefore, manufacturing cost become high and productivity becomes deteriorated.

SUMMARY OF THE INVENTION

The present invention has been made in an effort to solve the above problems.

It is a motivation of the present invention that there is no impurities on the exposed surface of a bonding pad.

It is another motivation of the present invention to prevent poor adhesion of solder and to produce devices having superior qualities.

To realize the above motivation, the present invention provides a method for forming a bonding pad of a semiconductor device comprising the steps of: (a) forming a top metal line having a predetermined width on a structure of a semiconductor substrate; (b) forming an insulating layer on the top metal line and the structure of the semiconductor substrate; (c) selectively etching the insulating layer to form a bonding pad which exposes portions of the top metal line; (d) performing a plasma treatment over the semiconductor substrate by using $CF_4$, Ar, and $O_2$ gas.

In the step (d) of performing the plasma treatment, the $CF_4$ gas may be supplied at a rate of 10-50 sccm, the Ar gas may be supplied at a rate of 100-300 sccm, and the $O_2$ gas may be supplied at a rate of 10-50 sccm.

In the step (d) of performing the plasma treatment, the plasma may be generated at an operating power of 50-200 W and at a bias frequency of 450 kHz.

The plasma treatment may be performed at a pressure of 150-300 mTorr.

After the step (d), a step (e) of cleaning the semiconductor substrate by dipping the semiconductor substrate into a solution for removing a polymer, into isopropyl alcohol, and into deionized water, in order, may be performed.

For example, the semiconductor substrate may be dipped into a solution for removing a polymer at a temperature of 50-100° C. for a time of less than 30 minutes, may be dipped into isopropyl alcohol at a temperature of 10-40° C. for a time of less than 30 minutes, and may be dipped into a deionized water at room temperature for a time of less than 20 minutes.

After the step (e), a step (f) of spraying isopropyl alcohol over the semiconductor substrate to dry a surface of the bonding pad and the insulating layer by means of volatilization of the isopropyl alcohol with moisture remaining on the surface of the bonding pad and the insulating layer, may be performed.

In the step (a) of forming a top metal line, a barrier metal layer may be formed on the top metal line, and the barrier metal layer and the top metal line may be selectively etched such that the barrier metal layer and the top metal line have a predetermined width.

The barrier metal layer may be formed of TiN.

In the step (b) of forming the insulating layer, a first oxide layer, a second oxide layer, and a nitride layer, in order, may be formed on the top metal line and the structure of the semiconductor substrate, as the insulating layer.

The first oxide layer may be formed at a thickness of between 4500 Å and 7500 Å, the second oxide layer may be formed at a thickness of between 2000 Å and 4000 Å, and the nitride layer may be formed at a thickness of between 8000 Å and 12000 Å.

In the step (c) of selectively etching the insulating layer to form a bonding pad, a photoresist pattern exposing the insulating layer of predetermined portions as the bonding pad may be formed on the insulating layer, the exposed insulating layer may be etched by using the photoresist pattern as a mask to form a bonding pad which exposes portions of the top metal line, and then the photoresist pattern may be removed.

The exposed insulating layer may be etched by using $SF_6$, $CF_4$, $CHF_3$, and Ar gas as an etching gas.

As the solution for removing a polymer, a solution for removing remaining photoresist after removing the photoresist pattern may be used.

The isopropyl alcohol may remove the organic material except for the photoresist.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

Preferred embodiments of the present invention will now be described in detail with reference to the accompanying drawings.

Figure 1:
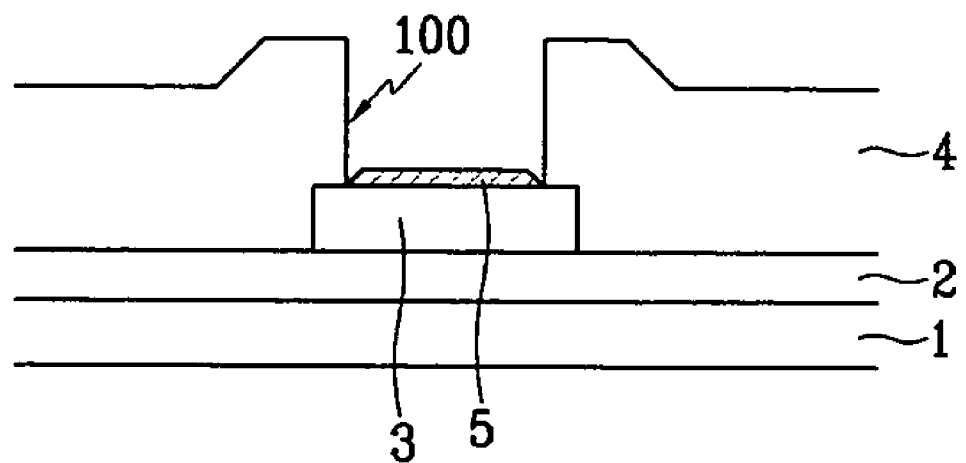
FIG. 1 is a cross-sectional view of a conventional bonding pad of a semiconductor device.
Figure 2A:
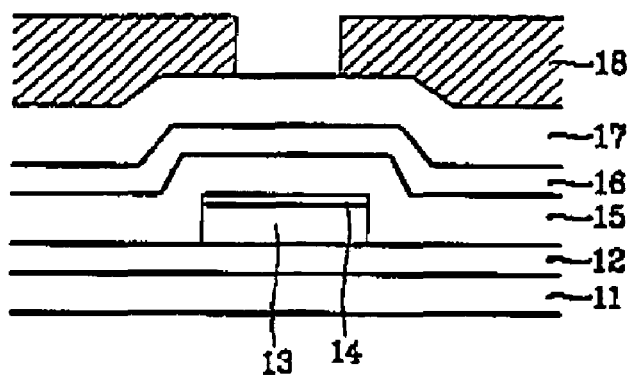
FIG. 2a to 2c show a cross-sectional view of a method for forming a bonding pad of a semiconductor device according to a preferred embodiment of the present invention.
Figure 2B:
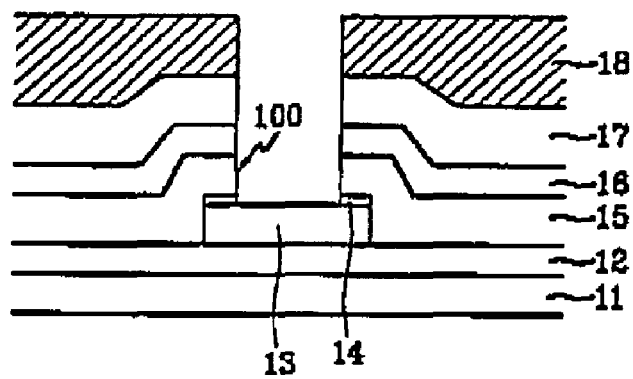
Figure 2C:
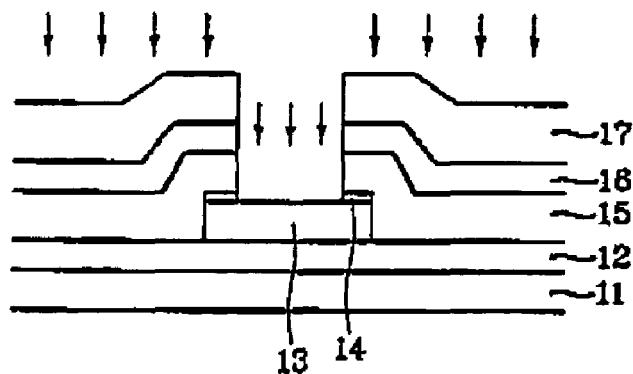

FIG. 2a to 2c show a cross-sectional view of a method for forming a bonding pad of a semiconductor device according to a preferred embodiment of the present invention.

First, with reference to FIG. 2a, there is a structure 11 of a semiconductor substrate, which includes individual devices over a semiconductor substrate and a lower metal line over a semiconductor substrate. A lower insulating layer 12 such as oxide is formed on the structure 11 of the semiconductor substrate. Here, the lower insulating layer 12 can be regarded as being included in the structure 11 of the semiconductor substrate.

Next, a top metal line 13 which is formed of Al or Cu is formed on the lower insulating layer 12, and then a barrier metal layer 14 which comprises TiN, is formed on the top metal layer 13.

The barrier metal layer 14 and the top metal line 13 are selectively etched such that the barrier metal layer 14 and the top metal line 13 have a predetermined width.

Next, an upper insulating layer is formed over the structure 11 of the semiconductor substrate, more particularly, a first oxide layer 15, a second oxide layer 16, and a nitride layer 17, in order, can be formed on the barrier metal layer 14 and the lower insulating layer 12, as the upper insulating layer.

Here, the upper insulating layer is formed as three-layered structure to obtain superior flatness of the surface of the upper insulating layer.

The first oxide layer 15 is formed at a thickness of between 4500 Å and 7500 Å, the second oxide layer 16 is formed at a thickness of between 2000 Å and 4000 Å, and the nitride layer 17 is formed at a thickness of between 8000 Å and 12000 Å. More preferably, the first oxide layer 15 can be formed at a thickness of 6000 Å, the second oxide layer 16 can be formed at a thickness of 3000 Å, and the nitride layer 17 can be formed at a thickness of 10000 Å.

Next, a photoresist is applied on the nitride layer 17 and the applied photoresist is exposed to lights and developed to form a photoresist pattern 18 which exposes the nitride layer 17 of predetermined portions as the bonding pad.

Next, with reference to FIG. 2b, the exposed nitride layer 17, the second oxide layer 16 under the exposed nitride layer 17, the first oxide layer 15, and the barrier metal layer 14 are etched by using the photoresist pattern as a mask to form a bonding pad 100 which exposes portions of the top metal line 13. Here, as an etching gas, $SF_6$, $CF_4$, $CHF_3$, and Ar gas are used.

After forming the bonding pad 100, the photoresist pattern 18 is removed and usual cleaning process is performed.

Next, with reference to FIG. 2c, a plasma treatment is performed over the semiconductor substrate by using $CF_4$, Ar, and $O_2$ gas. More particularly, the bonding pad 100 and the upper surface of the nitride layer 17 are plasma treated and all the remaining materials of the nitride layer 17, the second oxide layer 16, and the first oxide layer 15, which are on the exposed surface of the top metal line 13 through the bonding pad 100 and are not etched, are removed, such that the etching is performed precisely and cleanly in the original design.

During the plasma treatment, the $CF_4$ gas is supplied at a rate of 10-50 sccm, the Ar gas is supplied at a rate of 100-300 sccm, and the $O_2$ gas is supplied at a rate of 10-50 sccm. Further, the plasma is generated at an operating power of 50-200 W and at a bias frequency of 450 kHz. The plasma treatment is performed at a pressure of 150-300 mTorr.

After the plasma treatment, a cleaning process is performed by dipping the total structure of the semiconductor substrate into a solution.

During the cleaning process, the semiconductor substrate is firstly dipped into a solution for removing a polymer, more particularly removing the remaining photoresist material.

Secondly, the substrate is dipped into isopropyl alcohol which removes the organic material except for the photoresist.

Thirdly, the substrate is dipped into deionized water in which the ions are removed by electrolysis.

More particularly, the semiconductor substrate is dipped into a solution for removing a polymer at a temperature of 50-100° C. for a time of less than 30 minutes, into isopropyl alcohol at a temperature of 10-40° C. for a time of less than 30 minutes, and into deionized water at room temperature for a time of less than 20 minutes.

After these cleaning process, isopropyl alcohol is sprayed over the semiconductor substrate to dry a surface of the bonding pad 100 and the nitride layer 17 naturally by means of volatilization of the isopropyl alcohol with moisture remaining on the surface of the bonding pad 100 and the nitride layer 17.

Through plasma treatment, dipping cleaning process, and drying process, all impurities and reactants, for example, $Al_2O_3$ generated from the reaction with the atmosphere are removed from the side surfaces of the nitride layer 17, the second oxide layer 16, and the first oxide layer 15, as well as the upper surface of the top metal line 13.

Hereafter, wire bonding through the bonding pad 100 is described. A pre-cleaning process which usually performed before the bonding work can be omitted. Even though the wire bonding is directly performed without the pre-cleaning process, poor adhesion of the solder due to impurities on the surface of the top metal line is prevented.

In the present invention as described above, after going through the plasma treatment, the dipping cleaning process, and the drying process, under certain condition, impurities and reactants are removed from the exposed surface through the bonding pad, and therefore, poor adhesion of the solder in wire bonding is prevented and devices having superior qualities are produced.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A method for forming a bonding pad of a semiconductor device comprising the steps of:
   (a) forming a top metal line having a predetermined width on a structure of a semiconductor substrate;
   (b) forming an insulating layer on the top metal line and the structure of the semiconductor substrate;
   (c) selectively etching the insulating layer to form a bonding pad which exposes portions of the top metal line;
   (d) after selectively etching the insulating layer, performing a plasma treatment over the semiconductor substrate using $CF_4$, Ar, and $O_2$ gas; and
   (e) after performing said plasma treatment, cleaning the semiconductor substrate by dipping the semiconductor substrate into a solution for removing a polymer, into isopropyl alcohol, and into deionized water, in order.

2. The method of claim 1, wherein the step of performing the plasma treatment comprises supplying $CF_4$ at a rate of 10-50 sccm, supplying the Ar at a rate of 100-300 sccm, and supplying the $O_2$ gas at a rate of 10-50 sccm.

3. The method of claim 1, wherein the step of performing the plasma treatment comprises generating the plasma at an operating power of 50-200 W and at a bias frequency of 450 kHz.

4. The method of claim 1, wherein the plasma treatment is performed at a pressure of 150-300 mTorr.

5. The method of claim 1, wherein the semiconductor substrate is dipped into the solution for removing the polymer at a temperature of 50-100° C. for a time of less than 30 minutes.

6. The method of claim 1, wherein the semiconductor substrate is dipped into the isopropyl alcohol at a temperature of 10-40° C. for a time of less than 30 minutes.

7. The method of claim 1, wherein the semiconductor substrate is dipped into deionized water at room temperature for a time of less than 20 minutes.

8. The method of claim 1, further comprising the step (f) of spraying isopropyl alcohol over the semiconductor substrate to dry a surface of the bonding pad and the insulating layer, after the step (e).

9. The method of claim 1, wherein the step of forming the top metal line comprises forming a barrier metal layer on the top metal line, and selectively etching the barrier metal layer and the top metal line such that the barrier metal layer and the top metal line have a predetermined width.

10. The method of claim 9, wherein the barrier metal layer comprises TiN.

11. The method of claim 1, wherein the step of forming the insulating layer comprises forming a first oxide layer, a second oxide layer, and a nitride layer, in order, on the top metal line and the structure of the semiconductor substrate.

12. The method of claim 11, wherein the first oxide layer is formed at a thickness of between 4500 Å and 7500 Å, the second oxide layer is formed at a thickness of between 2000 Å and 4000 Å and the nitride layer is formed at a thickness of between 8000 Å and 12000 Å.

13. The method of claim 1, wherein the step of selectively etching the insulating layer comprises forming a photoresist pattern exposing predetermined portions of the insulating layer, etching the exposed insulating layer using the photoresist pattern as a mask to form the bonding pad, and then removing the photoresist pattern.

14. The method of claim 13, wherein etching the exposed insulating layer comprises using $SF_6$, $CF_4$, $CHF_3$, and Ar gas as an etching gas.

15. The method of claim 1, wherein the step (c) of selectively etching the insulating layer to form the bonding pad comprises using a photoresist pattern for exposing the insulating layer of predetermined portions when forming the bonding pad on the insulating layer, etching the exposed insulating layer by using the photoresist pattern as a mask for forming the bonding pad which exposes portions of the top metal line, and then removing the photoresist pattern.

16. The method of claim 15, wherein the solution for removing the polymer comprises a solution for removing remaining photoresist after removing the photoresist pattern.

17. The method of claim 15, wherein the isopropyl alcohol removes organic material except for the photoresist.

18. The method of claim 8, wherein the surface of the bonding pad and the insulating layer are dried by means of volatilization of the isopropyl alcohol with moisture remaining on the surface of the bonding pad and the insulating layer.

19. The method of claim 13, wherein etching the exposed insulating layer exposes portions of the top metal line.

* * * * *